(12) United States Patent
Wilson et al.

(10) Patent No.: US 8,779,856 B2
(45) Date of Patent: Jul. 15, 2014

(54) DOHERTY AMPLIFIER CIRCUIT WITH PHASE-CONTROLLED LOAD MODULATION

(71) Applicant: Infineon Technologies North America Corp., Milpitas, CA (US)

(72) Inventors: Richard Wilson, Morgan Hill, CA (US); Saurabh Goel, Campbell, CA (US)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 13/665,321

(22) Filed: Oct. 31, 2012

(65) Prior Publication Data

US 2014/0118070 A1    May 1, 2014

(51) Int. Cl.
*H03F 3/68* (2006.01)
(52) U.S. Cl.
USPC .................................... 330/295; 330/124 R
(58) Field of Classification Search
USPC ................................ 330/295, 124 R, 84, 126
See application file for complete search history.

(56) References Cited

U.S. PATENT DOCUMENTS

| | | | | |
|---|---|---|---|---|
| 7,248,108 B2* | 7/2007 | Fratti | | 330/124 R |
| 8,593,219 B1* | 11/2013 | Root | | 330/124 R |
| 2012/0235734 A1* | 9/2012 | Pengelly | | 330/124 D |
| 2013/0141166 A1* | 6/2013 | He et al. | | 330/295 |
| 2014/0035678 A1* | 2/2014 | Cui et al. | | 330/295 |

* cited by examiner

*Primary Examiner* — Henry Choe
(74) *Attorney, Agent, or Firm* — Murphy, Bilak & Homiller, PLLC (57) ABSTRACT

A symmetric Doherty amplifier includes a main amplifier and a peaking amplifier of the same size as the main amplifier. The symmetric Doherty amplifier is configured to operate at peak output power when the main amplifier and the peaking amplifier are each in saturation, and at output-back-off (OBO) when the main amplifier is in saturation and the peaking amplifier is not in saturation. Phase shift circuitry is configured to shift the phase at an output of the peaking amplifier at OBO so that a load impedance seen by the main amplifier and efficiency of the symmetric Doherty amplifier both increase at OBO as a function of the phase shift at the peaking amplifier output.

25 Claims, 8 Drawing Sheets

DOHERTY AMPLIFIER CIRCUIT WITH PHASE-CONTROLLED LOAD MODULATION

TECHNICAL FIELD

The present application relates to Doherty amplifiers, in particular Doherty amplifiers having efficient operation over a wide OBO (Output Back-Off) range.

BACKGROUND

RF (radio frequency) power architectures within the telecommunications field focus on achieving high DC-to-RF efficiency at significant power back-off from Psat (the average output power when the amplifier is driven deep into saturation). This is due to the high peak to average ratio (PAR) of the transmitted digital signals, such as W-CDMA (wideband code division multiple access), LTE (long term evolution) and WiMAX (worldwide interoperability for microwave access). The most popular power amplifier architecture currently employed is the Doherty amplifier. The Doherty amplifier uses a class AB main amplifier and a class C peaking amplifier, and efficiency is enhanced through load modulation of the main amplifier from the peaking amplifier.

If high efficiency at a high output back-off (OBO) is required, a highly asymmetric ratio between the size of main and peaking amplifiers is typically required. However, such an asymmetry requirement limits the maximum RF output power that can be obtained from such a design. A 3-way Doherty amplifier can also be used to operate at more than 6 dB from the peak output power, i.e., at more than 6 dB OBO. However, three-way Doherty amplifiers are complicated and have a long design process, lack performance consistency, and require a larger physical layout. Neither of the aforementioned approaches allow for dynamic load modulation. An architecture called 'envelope tracking' or 'drain modulation' can also be used to provide high efficiency at more than 6 dB OBO, but this approach requires very significant system redesign and additional complexity.

SUMMARY

Embodiments described herein eliminate the use of differently sized transistors in Doherty amplifier circuit designs, and allow for higher efficiency when operating at 6 dB or more from the peak output power, i.e., at 6 dB OBO or more. The symmetric Doherty amplifier circuit described herein includes a main amplifier and a peaking amplifier of the same size. By dynamically controlling the VSWR (voltage standing waver ratio) seen by the main amplifier, the maximum-efficiency operating point of the symmetric Doherty amplifier at OBO can be moved dynamically across the output power range of interest. VSWR is a measure of the load that the main amplifier sees at any output power level relative to the load that the main amplifier sees at the peak power level of the Doherty. VSWR can be controlled by shifting the phase at the output of the peaking amplifier at OBO. For example, the symmetric Doherty amplifier circuit can be operated with a high efficiency anywhere between 6 dB OBO and 12 dB OBO or even higher OBO by adjusting the VSWR seen by the main amplifier.

According to an embodiment of a Doherty amplifier circuit, the circuit comprises a symmetric Doherty amplifier including a main amplifier and a peaking amplifier of the same size as the main amplifier. The symmetric Doherty amplifier is configured to operate at peak output power when the main amplifier and the peaking amplifier are each in saturation and at output-back-off (OBO) when the main amplifier is in saturation and the peaking amplifier is not in saturation. The Doherty amplifier circuit further comprises phase shift circuitry configured to shift the phase at the output of the peaking amplifier at OBO so that a load impedance seen by the main amplifier and efficiency of the symmetric Doherty amplifier both increase at OBO as a function of the phase shift at the peaking amplifier output.

According to an embodiment of a method of operating a Doherty amplifier circuit including a main amplifier and a peaking amplifier of the same size as the main amplifier, the method comprises: operating the symmetric Doherty amplifier at peak output power when the main amplifier and the peaking amplifier are each in saturation and at output-back-off (OBO) when the main amplifier is in saturation and the peaking amplifier is not in saturation; and shifting the phase at the output of the peaking amplifier at OBO so that a load impedance seen by the main amplifier and efficiency of the symmetric Doherty amplifier both increase at OBO as a function of the phase shift at the peaking amplifier output.

According to another embodiment of a Doherty amplifier circuit, the circuit comprises: a symmetric Doherty amplifier including a first amplifier of a first size and a second amplifier of a second size that is equal to the first size. The symmetric Doherty amplifier is configured to operate at peak output power when the first amplifier and the second amplifier are each in saturation and at output-back-off (OBO) when the first amplifier is in saturation and the second amplifier is not in saturation. The Doherty amplifier circuit further comprises circuitry configured to dynamically control a voltage standing wave ratio (VSWR) seen by the first amplifier so that a maximum-efficiency operating point of the symmetric Doherty amplifier at OBO can move to any operating point between at least 6 dB OBO and 12 dB OBO by changing the VSWR seen by the first amplifier.

According to another embodiment of operating a Doherty amplifier circuit including a first amplifier of a first size and a second amplifier of a second size equal to the first size, the method comprises: operating the symmetric Doherty amplifier at peak output power when the first amplifier and the second amplifier are each in saturation and at output-back-off (OBO) when the first amplifier is in saturation and the second amplifier is not in saturation; and dynamically controlling a voltage standing wave ratio (VSWR) seen by the first amplifier so that a maximum-efficiency operating point of the symmetric Doherty amplifier at OBO can move to any operating point between at least 6 dB OBO and 12 dB OBO by changing the VSWR seen by the first amplifier.

According to yet another embodiment of a Doherty amplifier circuit, the circuit comprises a Doherty amplifier and phase shift circuitry. The Doherty amplifier comprises a main amplifier and a peaking amplifier, and is configured to operate at peak output power when the main amplifier and the peaking amplifier are each in saturation and at output-back-off (OBO) when the main amplifier is in saturation and the peaking amplifier is not in saturation. The phase shift circuitry is configured to shift the phase at an output of the peaking amplifier at OBO so that a load impedance seen by the main amplifier and efficiency of the Doherty amplifier both increase at OBO as a function of the phase shift at the peaking amplifier output.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate cor

DETAILED DESCRIPTION

Figure 1:
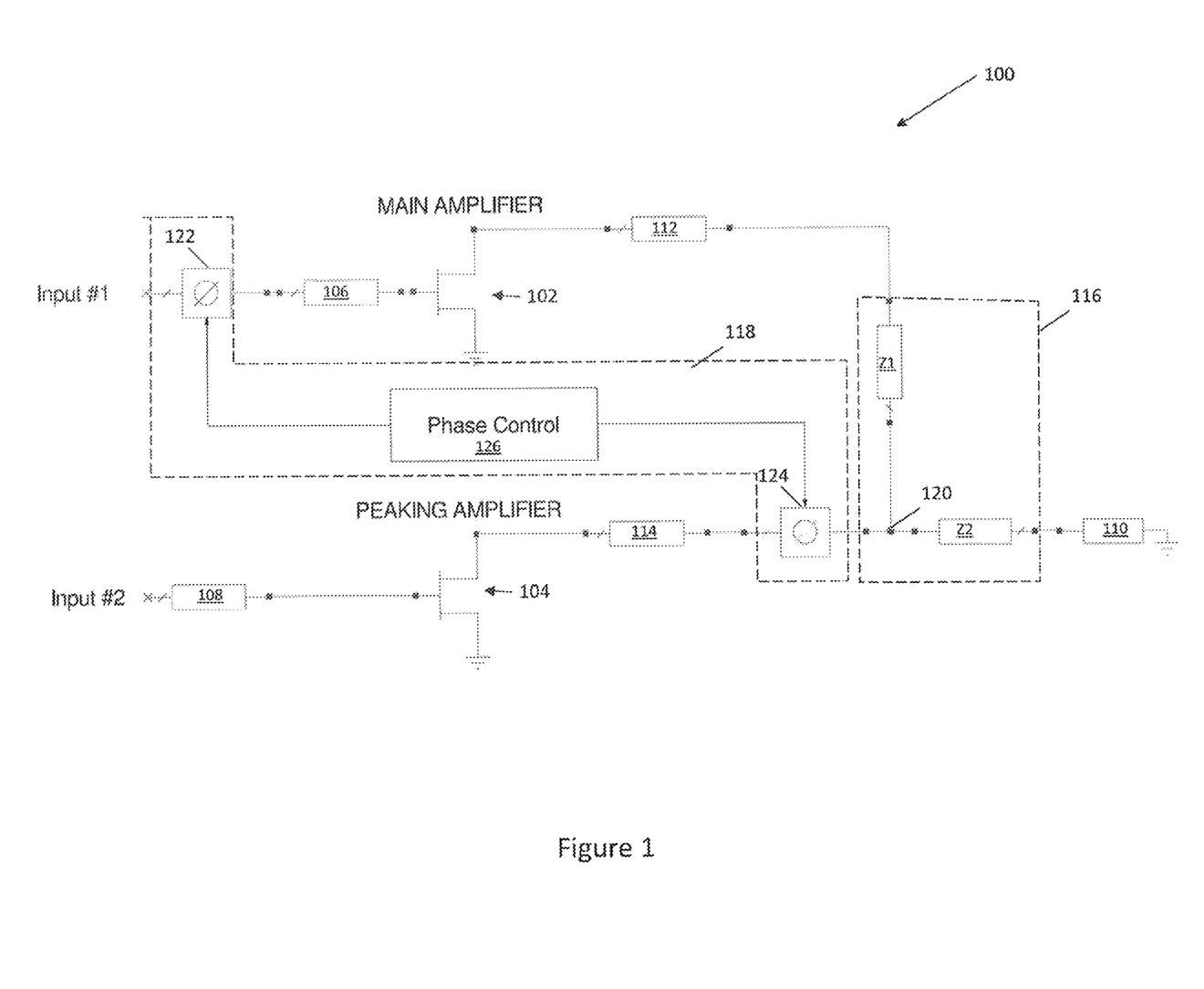
- FIG. 1 illustrates a schematic circuit diagram of a symmetric Doherty amplifier circuit having a phase-shifted peaking amplifier output at OBO according to an embodiment.

FIG. 1 illustrates an embodiment of a symmetric Doherty amplifier circuit 100 which includes a main amplifier 102 and a peaking amplifier 104. The main amplifier 102 is biased at Class B or AB mode, and the peaking amplifier 104 is biased at Class C mode. The main and peaking amplifiers 102, 104 have the same size, i.e., the main and peaking amplifiers 102, 104 are not intentionally sized differently. Alternatively, the peaking amplifier 104 can be slightly smaller or larger than the main amplifier 102. In each case, each amplifier 102, 104 is coupled to a corresponding input (Input #1, Input #2) via an input matching device 106, 108. The amplifiers 102, 104 are coupled to a load 110 via respective output matching devices 112, 114 and an impedance combiner 116. The impedance combiner 116 is illustrated as a Doherty combiner in FIG. 1. In general, however, any type of suitable impedance combiner can be used to connect the amplifiers 102, 104 to the load 110. One or both of the output matching devices 112, 114 can be absorbed into the impedance combiner 116.

At low power levels, only the main amplifier 102 is operational. The efficiency of the main amplifier 102 increases as the power level increases. The main amplifier 102 eventually reaches a maximum efficiency point (i.e., saturation) as the power level continues to rise. At this power level, the peaking amplifier 104 turns on. The efficiency of the peaking amplifier 104 similarly increases for power levels above this point and eventually reaches its maximum efficiency point (i.e., saturation), at which point the symmetric Doherty amplifier circuit 100 operates at peak power output. That is, the symmetric Doherty amplifier circuit 100 operates at peak output power when the both amplifiers 102, 104 are in saturation and at OBO when the main amplifier 102 is in saturation and the peaking amplifier 104 is not in saturation.

Efficiency of the symmetric Doherty amplifier circuit 100 at an OBO operating point from the peak output power depends upon the VSWR seen by the main amplifier 102. The main amplifier 102 can be made to operate at high VSWR by controlling the phase at the output of the peaking amplifier 104. Extra phase at the output of peaking amplifier increases the VSWR seen by main amplifier 102. The symmetric Doherty amplifier circuit 100 can operate at high efficiency at more than 6 dB back-off from the peak output power (i.e., at more than 6 dB OBO) by correspondingly shifting the phase at the output of the peaking amplifier 104. The phase at the output of the peaking amplifier 104 can be dynamically changed, resulting in phase-controlled load modulation of the main amplifier 102. By dynamically controlling the VSWR and the load modulation of the main amplifier 102 in this way, the maximum-efficiency operating point of the symmetric Doherty amplifier circuit 100 at OBO can be moved dynamically across the output power range. For example, the maximum-efficiency operating point of the symmetric Doherty amplifier circuit 100 at OBO can occur anywhere between 6 dB and 12 dB OBO or more by appropriately shifting the phase of the peaking amplifier 104. For cases where the peaking amplifier 104 is slightly smaller than the main amplifier 102, the load modulation seen by the main amplifier 102 can also cover less than 6 dB OBO.

To this end, the symmetric Doherty amplifier circuit 100 includes phase shift circuitry 118 which shifts the output phase of the peaking amplifier 104 at OBO so that the load impedance seen by the main amplifier 102 and efficiency of the symmetric Doherty amplifier circuit 100 both increase at OBO as a function of the phase shift at the peaking amplifier output. This allows the main amplifier 102 to operate into a higher impedance i.e. the main amplifier 102 sees higher VSWR, therefore becoming more efficient.

Figure 2:
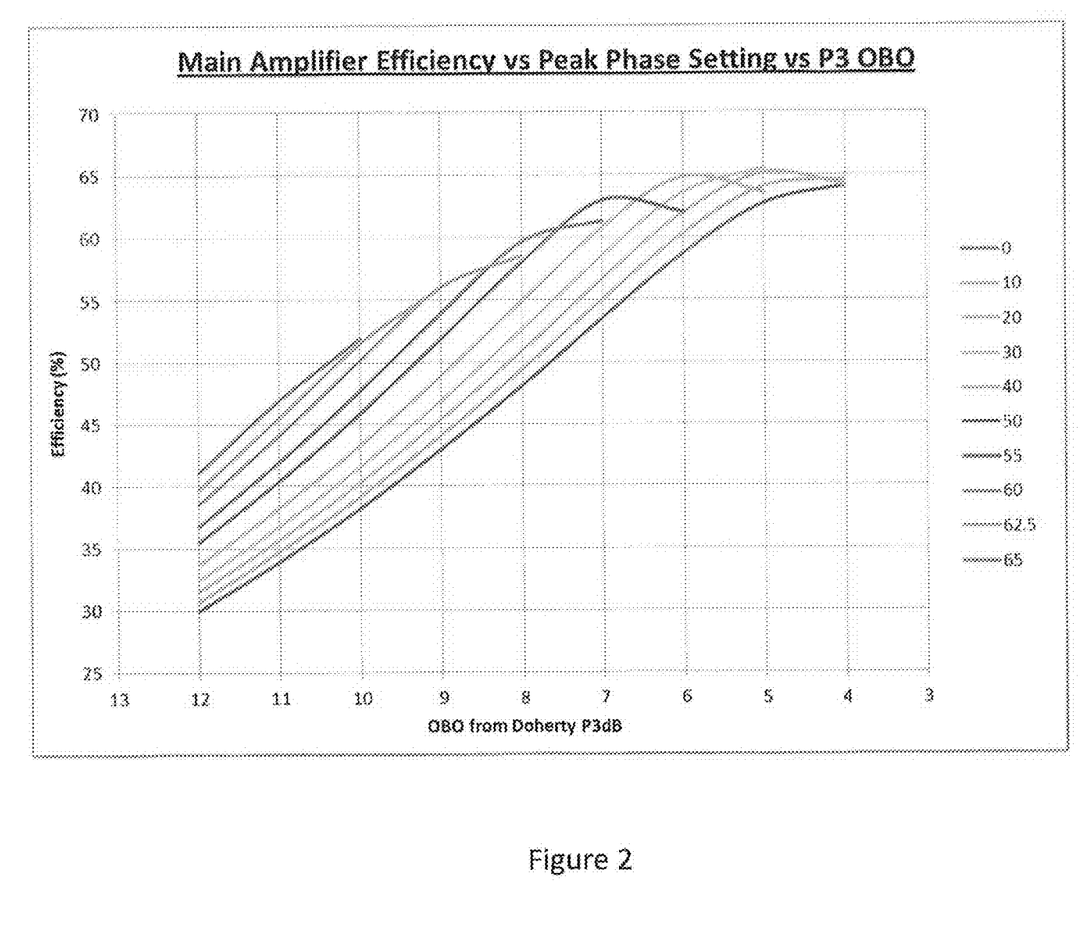
FIG. 2 is a plot diagram showing main amplifier efficiency as a function of OBO for different phase shifts at the peaking amplifier output.

FIG. 2 illustrates a plot diagram showing the main amplifier efficiency as a function of OBO from the peak power output (P3 dB), for different phase shifts at the peaking amplifier output. As can be seen in FIG. 2, the phase at the peaking amplifier output is shifted by 0 to 65 degrees at OBO. In one embodiment, the phase at the output of the peaking amplifier 104 is shifted by 10 to 60 degrees at OBO. Increasing the phase at the peaking amplifier output increases the VSWR seen by the main amplifier 102, which in turn increases the efficiency of the symmetric Doherty amplifier circuit 100 for a particular OBO operating point.

The maximum-efficiency of the symmetric Doherty amplifier circuit 100 at OBO can be moved to any OBO operating point between, e.g., 6 dB OBO and 12 dB OBO or more by changing the VSWR seen by the main amplifier 102, i.e., by shifting the phase at the output of the peaking amplifier 104. This is also illustrated in FIG. 2, which shows that the symmetric Doherty amplifier circuit 100 reaches a maximum-efficiency operating point at 6 dB OBO when the output phase of the peaking amplifier 104 is increased by 40 degrees, a maximum-efficiency operating point at 7 dB OBO when the output phase of the peaking amplifier 104 is increased by 50 degrees, a maximum-efficiency operating point at 8 dB OBO when the phase at the output of the peaking amplifier 104 is increased by 55 degrees, etc.

Load modulation of the main amplifier 102 is implemented by the fundamental current ratio between the main amplifier 102 and the peaking amplifier 104. In addition, the Doherty combiner 116 combines or sums the load currents of the amplifiers 102, 104 at a summing node 120 so that the output voltage of the symmetric Doherty amplifier circuit 100 is determined by the summation of the load currents multiplied by the load impedance. To this end, the Doherty combiner 116 includes a first impedance Z1 which couples the output of the main amplifier 102 to the summing node 120. The output of the peaking amplifier 104 is also coupled to the summing node 120. A second impedance Z2 of the Doherty combiner 116 couples the summing node 120 to the load 110.

In some embodiments, the phase shift circuitry 118 can dynamically shift the phase at the output of the peaking amplifier 104 in order to phase-control the load modulation of the main amplifier 102. This in turn allows the main amplifier 102 to work into different impedances when warranted (i.e., the main amplifier 102 can see different VSWRs), therefore becoming more efficient over a wide range of output power.

Figure 3:
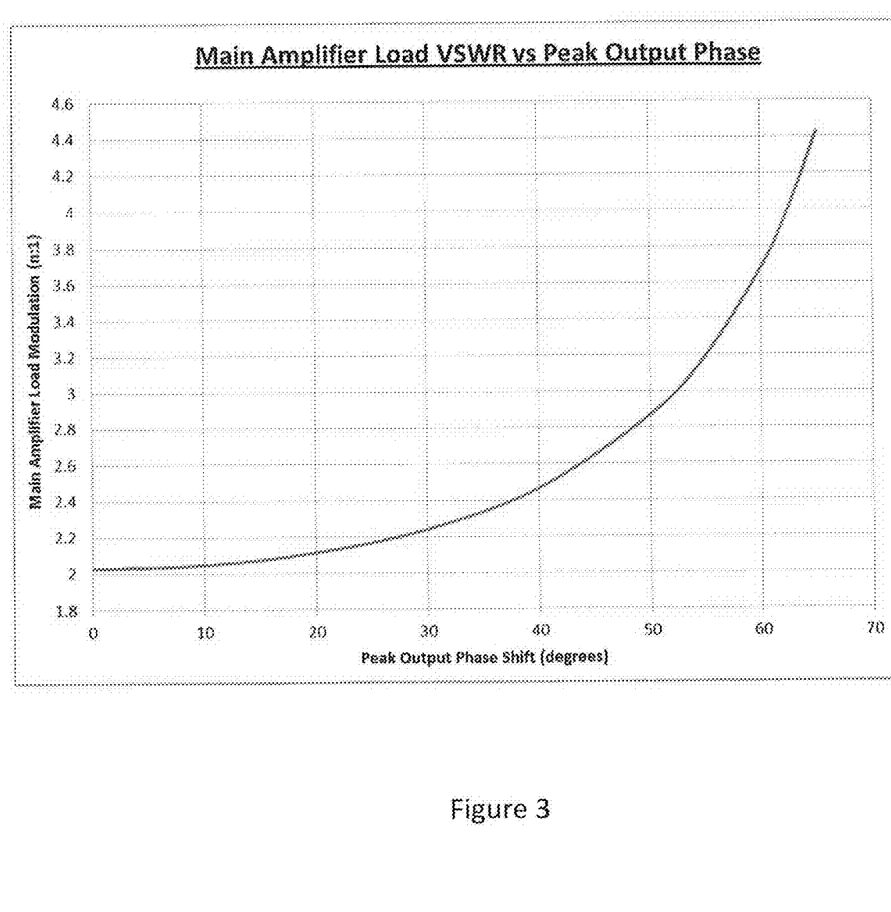
FIG. 3 is a plot diagram showing main amplifier load modulation as a function of phase shift at the peaking amplifier output.

FIG. 3 illustrates a plot diagram showing the main amplifier load modulation (i.e., VSWR) as a function of the phase shift at the peaking amplifier output. As shown, the main amplifier load modulation increases as a function of increasing phase shift at the peaking amplifier output. The relationship between VSWR and peaking amplifier output phase allows the main amplifier 102 to work into higher impedances in order to increase the efficiency of the symmetric Doherty amplifier circuit 100.

Figure 4:
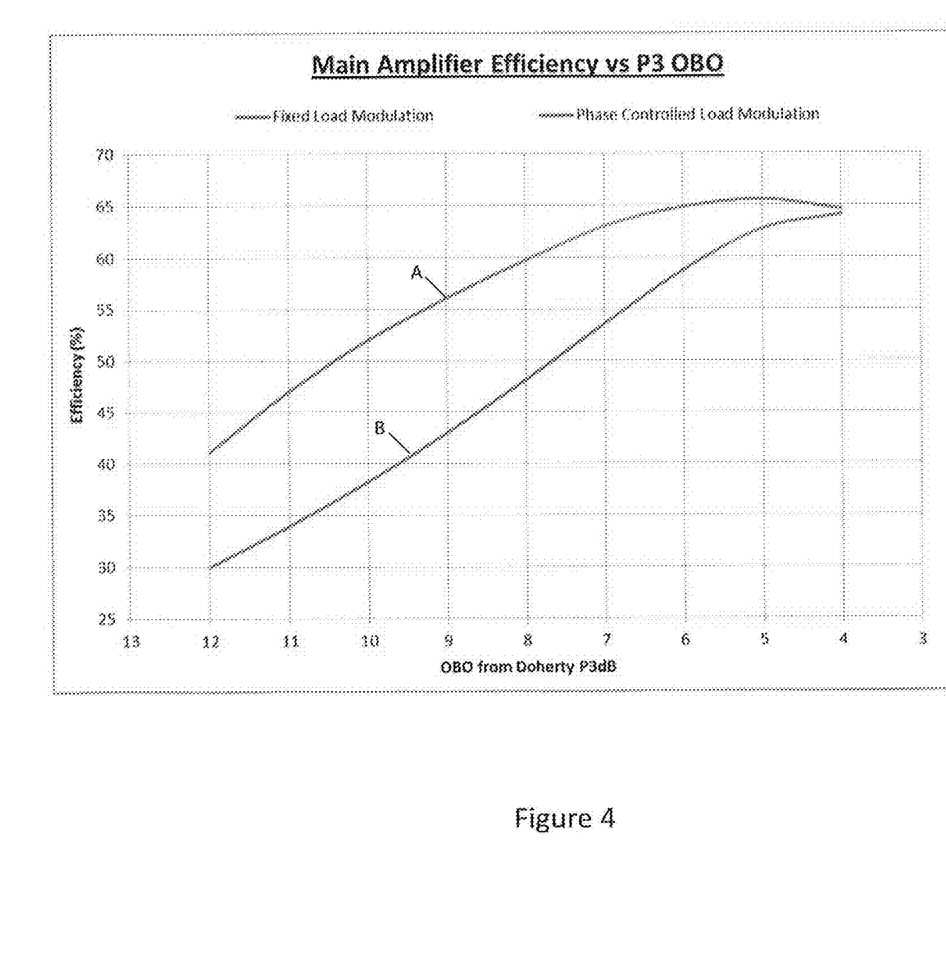
FIG. 4 is a plot diagram showing main amplifier efficiency as a function of OBO.

FIG. 4 illustrates a plot diagram showing the main amplifier efficiency as a function of OBO from the peak power output (P3 dB). The curve labeled 'A' in FIG. 4 corresponds to the main amplifier efficiency as a function of OBO from the peak power output with phase-controlled load modulation, and the curve labeled 'B' corresponds to the main amplifier efficiency with fixed load modulation, i.e., with no phase shifting at the peaking amplifier output. Phase-controlled load modulation of the main amplifier 102 can be realized by controlling the output phase of the peaking amplifier 104 as previously explained herein. The VSWR seen by the main amplifier 102 increases correspondingly as a function of the amount of phase shift imparted by the phase shift circuitry 118 to the output of the peaking amplifier 104.

In one embodiment, the phase shift circuitry 118 comprises a first phase shifter 122 coupled to the input of the main amplifier 102 and a second phase shifter 124 coupled to the output of the peaking amplifier 104. The first phase shifter 122 imparts a phase shift to the input of the main amplifier 102 and the second phase shifter 124 similarly imparts a phase shift to the output of the peaking amplifier 104. The phase shifters 122, 124 can be configured by a phase control circuit 126 to impart the same phase shift. That is, the first phase shifter 122 can impart the same phase shift to the input of the main amplifier 102 as the second phase shifter 124 imparts to the output of the peaking amplifier 104.

Figure 5:
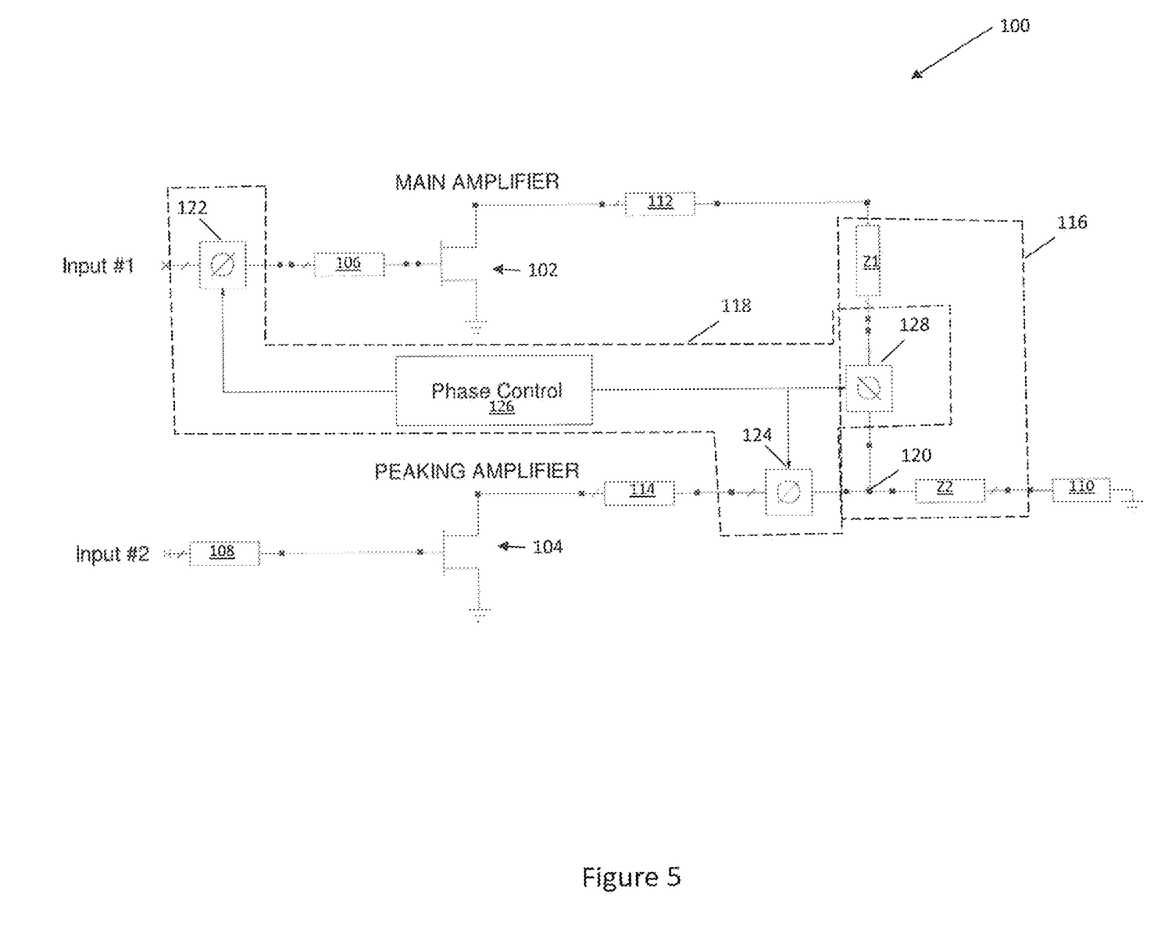
FIG. 5 illustrates a schematic circuit diagram of a symmetric Doherty amplifier circuit having a phase-shifted peaking amplifier output according to another embodiment.

FIG. 5 illustrates another embodiment of the symmetric Doherty amplifier circuit 100. The embodiment shown in FIG. 5 is similar to the embodiment shown in FIG. 1, however the phase shift circuitry 118 also comprises a third phase shifter 128 integrated in the Doherty combiner 116 between impedance Z1 and the summing node 120. Each phase shifter 122, 124, 128 can be configured by the phase control circuit 126. Phase shifter 124 at the output of the peaking amplifier 104 sets the VSWR seen by the main amplifier 102. The other phase shifters 122 and 128 provide a combined phase shift approximately equal (i.e. identically or nearly equal) to the phase shift provided by phase shifter 124. The phase shifters 122, 124, 128 which form part of the phase shift circuitry 118 can provide a fixed amount of phase shift or an adjustable amount of phase shift, depending on the application in which the symmetric Doherty amplifier circuit 100 is used.

Figure 6:
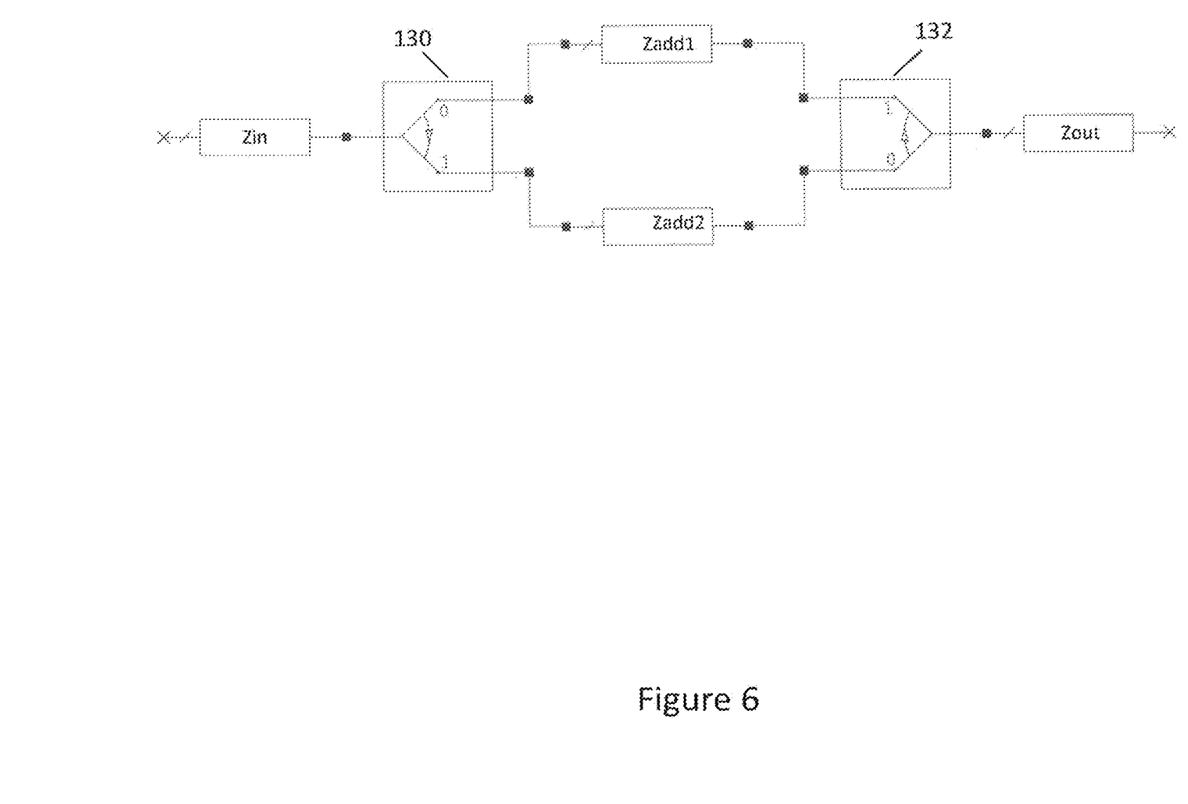
FIG. 6 illustrates a schematic circuit diagram of a phase shifter included in the symmetric Doherty amplifier circuit according to an embodiment.

FIG. 6 illustrates an embodiment of the phase shifters 122, 124, 128 included in the phase shift circuitry 118. According to this embodiment, the phase shifters 122, 124, 128 include a first switch 130 coupled to an input impedance Zin and a second switch 132 coupled to an output impedance Zout. Between the switches 130, 132 are at least two additional transmission lines with impedances Zadd1, Zadd2 of different length. A phasing line can be formed by setting the switches 130, 132 so that one of the intermediate impedances Zadd1, Zadd2 are connected between the input and output impedances Zin, Zout. For example, at peak output power when both transistors 102, 104 are in saturation, the phase control circuit 118 sets the switches 130, 132 so that the optimal-length intermediate impedance (e.g. Zadd1) for peak output power is connected between the input and output impedances Zin, Zout. At OBO, the output phase of the peaking amplifier 104 is increased when the phase control circuit 118 sets the switches 130, 132 so that a longer intermediate impedance (e.g. Zadd2) is connected between the input and output impedances Zin, Zout to form a longer phasing line. This way, the length of the phasing lines connected to the output of the peaking amplifier 104 and the input of the main amplifier 102 can be adjusted under OBO conditions. Any desirable number of different length intermediate impedances can be provided, so that the phasing lines constructed by setting the switches 130, 132 can be extended over a wide range of degrees (e.g., 10 to 60 degrees) and amplifier efficiency can be maximized over of a wide range of OBO operating points (e.g., 6 dB OBO to 12 dB OBO or more).

Figure 7:
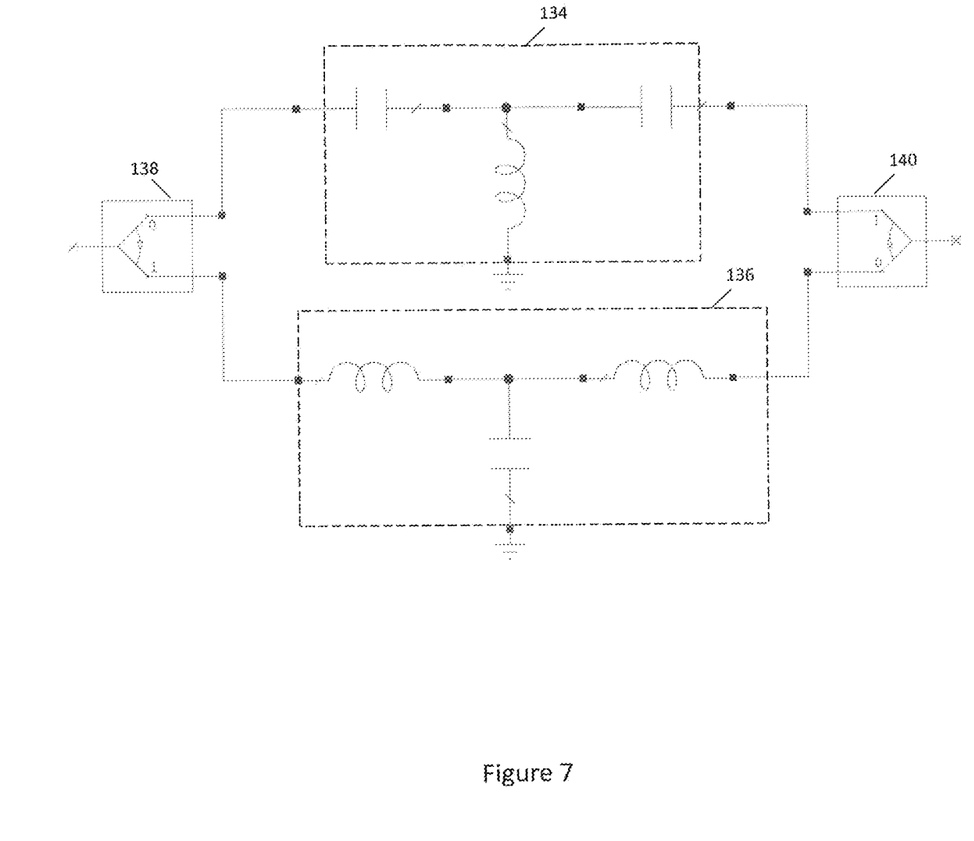
FIG. 7 illustrates a schematic circuit diagram of a phase shifter included in the symmetric Doherty amplifier circuit according to another embodiment.

FIG. 7 illustrates another embodiment of the phase shifters 122, 124, 128 included in the phase shift circuitry 118. According to this embodiment, the phase shifters 122, 124, 128 include a high-pass circuit 134 and a low-pass circuit 136 between two switches 138, 140. At peak output power, the phase control circuit 118 sets the switches 138, 140 so that the high-pass circuit 134 is switched into the amplifier circuit 100. The output phase of the peaking amplifier 104 is increased at OBO when the phase control circuit 118 sets the switches 138, 140 so that the low-pass circuit 136 is switched into the amplifier circuit 100, thereby effectively lengthening the phasing lines connected to the amplifiers 102, 104.

Figure 8:
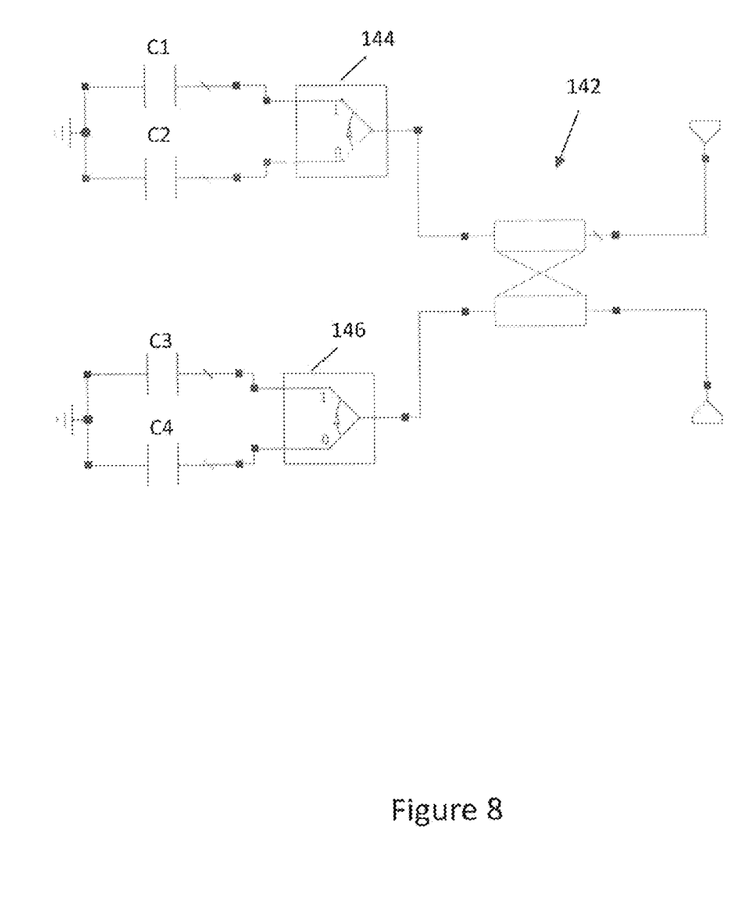
FIG. 8 illustrates a schematic circuit diagram of a phase shifter included in the symmetric Doherty amplifier circuit according to yet another embodiment.

FIG. 8 illustrates another embodiment of the phase shifters 122, 124, 128 included in the phase shift circuitry 118. According to this embodiment, the phase shifters 122, 124, 128 comprise a quadrature phase shifter core 142 and switches 144, 146 which can controllably connect different value capacitors C1, C2, C3, C4 to the quadrature phase shifter core 142 depending on the power state of the amplifier circuit 100. For example, more phase shift can be provided during OBO conditions by switchably connecting the appropriate value capacitors C1/C3 or C2/C4 to the quadrature phase shifter core 142. Other phase shifter circuits can be employed to shift the output phase of the peaking amplifier 104.

Terms such as "same", "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Doherty amplifier circuit, comprising:
a symmetric Doherty amplifier comprising a main amplifier and a peaking amplifier of the same size as the main amplifier, the symmetric Doherty amplifier configured to operate at peak output power when the main amplifier and the peaking amplifier are each in saturation and at output-back-off (OBO) when the main amplifier is in saturation and the peaking amplifier is not in saturation; and
phase shift circuitry configured to shift the phase at an output of the peaking amplifier at OBO so that a load impedance seen by the main amplifier and efficiency of the symmetric Doherty amplifier both increase at OBO as a function of the phase shift at the peaking amplifier output.

2. The Doherty amplifier circuit according to claim 1, wherein the phase shift circuitry comprises a first phase shifter coupled to an input of the main amplifier and a second phase shifter coupled to the output of the peaking amplifier, and wherein the first and second phase shifters are configured to impart the same phase shift.

3. The Doherty amplifier circuit according to claim 2, further comprising a Doherty combiner configured to couple the main and peaking amplifiers to a load, wherein the phase shift circuitry further comprises a third phase shifter integrated in the Doherty combiner, and wherein the first phase shifter and the third phase shifter provide a combined phase shift approximately equal to a phase shift provided by the second phase shifter.

4. The Doherty amplifier circuit according to claim 1, wherein the phase shift circuitry is configured to shift the phase at the output of the peaking amplifier by 10 to 60 degrees at OBO.

5. The Doherty amplifier circuit according to claim 1, wherein the phase shift circuitry is configured to shift the phase at the output of the peaking amplifier at OBO over a range of degrees sufficient to move a maximum-efficiency operating point of the symmetric Doherty amplifier at OBO to any operating point between at least 6 dB OBO and 12 dB OBO.

6. The Doherty amplifier circuit according to claim 1, wherein the phase shift circuitry is configured to shift the phase at the output of the peaking amplifier at OBO by lengthening a phasing line connected to the output of the peaking amplifier and lengthening a phasing line connected to an input of the main amplifier.

7. The Doherty amplifier circuit according to claim 6, wherein the phase shift circuitry is configured to lengthen the phasing lines by 10 to 60 degrees at OBO.

8. A method of operating a Doherty amplifier circuit including a main amplifier and a peaking amplifier of the same size as the main amplifier, the method comprising:
operating the symmetric Doherty amplifier at peak output power when the main amplifier and the peaking amplifier are each in saturation and at output-back-off (OBO) when the main amplifier is in saturation and the peaking amplifier is not in saturation; and
shifting the phase at an output of the peaking amplifier at OBO so that a load impedance seen by the main amplifier and efficiency of the symmetric Doherty amplifier both increase at OBO as a function of the phase shift at the peaking amplifier output.

9. The method according to claim 8, wherein shifting the phase at the output of the peaking amplifier at OBO comprises imparting the same phase shift at the output of the peaking amplifier and at an input of the main amplifier.

10. The method according to claim 9, further comprising imparting the same phase shift to a phasing line of a Doherty combiner which couples the main and peaking amplifiers to a load.

11. The method according to claim 8, wherein the phase at the output of the peaking amplifier is shifted by 10 to 60 degrees at OBO.

12. The method according to claim 8, wherein the phase at the output of the peaking amplifier at OBO can be shifted over a range of degrees sufficient to move a maximum-efficiency operating point of the symmetric Doherty amplifier at OBO to any operating point between at least 6 dB OBO and 12 dB OBO.

13. The method according to claim 8, wherein shifting the phase at the output of the peaking amplifier at OBO comprises:
lengthening a phasing line connected to the output of the peaking amplifier; and
lengthening a phasing line connected to an input of the main amplifier.

14. The method according to claim 13, wherein the phasing lines are lengthened by 10 to 60 degrees at OBO.

15. A Doherty amplifier circuit, comprising:
a symmetric Doherty amplifier comprising a first amplifier of a first size and a second amplifier of a second size equal to the first size, the symmetric Doherty amplifier configured to operate at peak output power when the first amplifier and the second amplifier are each in saturation and at output-back-off (OBO) when the first amplifier is in saturation and the second amplifier is not in saturation; and
circuitry configured to dynamically control a voltage standing wave ratio (VSWR) seen by the first amplifier so that a maximum-efficiency operating point of the symmetric Doherty amplifier at OBO can move to any operating point between at least 6 dB OBO and 12 dB OBO by changing the VSWR seen by the first amplifier.

16. The Doherty amplifier circuit according to claim 15, wherein the circuitry comprises a phase shifter configured to shift the phase at an output of the second amplifier at OBO so that the VSWR seen by the first amplifier increases at OBO.

17. The Doherty amplifier circuit according to claim 16, wherein the phase shifter is configured to shift the phase at the output of the second amplifier at OBO by 10 to 60 degrees.

18. The Doherty amplifier circuit according to claim 16, wherein the phase shifter is configured to shift the phase at the output of the second amplifier at OBO by lengthening a phasing line connected to the output of the second amplifier.

19. The Doherty amplifier circuit according to claim 18, wherein the phase shifter is configured to lengthen the phasing line at OBO by 10 to 60 degrees.

20. A method of operating a Doherty amplifier circuit including a first amplifier of a first size and a second amplifier of a second size equal to the first size, the method comprising:
operating the symmetric Doherty amplifier at peak output power when the first amplifier and the second amplifier are each in saturation and at output-back-off (OBO) when the first amplifier is in saturation and the second amplifier is not in saturation; and dynamically controlling a voltage standing wave ratio (VSWR) seen by the first amplifier so that a maximum-efficiency operating point of the symmetric Doherty amplifier at OBO can move to any operating point between at least 6 dB OBO and 12 dB OBO by changing the VSWR seen by the first amplifier.

21. The method according to claim 20, wherein dynamically controlling the VSWR seen by the first amplifier comprises shifting the phase at an output of the second amplifier at OBO so that the VSWR seen by the first amplifier increases at OBO.

22. The method according to claim 21, wherein the phase at the output of the second amplifier is shifted by 10 to 60 degrees at OBO.

23. The method according to claim 21, wherein shifting the phase at the output of the second amplifier at OBO comprises lengthening a phasing line connected to the output of the second amplifier.

24. The method according to claim 23, wherein the phasing line is lengthened by 10 to 60 degrees at OBO.

25. A Doherty amplifier circuit, comprising:

a Doherty amplifier comprising a main amplifier and a peaking amplifier, the Doherty amplifier configured to operate at peak output power when the main amplifier and the peaking amplifier are each in saturation and at output-back-off (OBO) when the main amplifier is in saturation and the peaking amplifier is not in saturation; and phase shift circuitry configured to shift the phase at an output of the peaking amplifier at OBO so that a load impedance seen by the main amplifier and efficiency of the Doherty amplifier both increase at OBO as a function of the phase shift at the peaking amplifier output.

* * * * *